United States Patent [19]
Lee et al.

[11] Patent Number: 5,858,833
[45] Date of Patent: Jan. 12, 1999

[54] METHODS FOR MANUFACTURING INTEGRATED CIRCUIT MEMORY DEVICES INCLUDING TRENCH BURIED BIT LINES

[75] Inventors: Won-seong Lee; Chang-gyu Hwang, both of Seoul, Rep. of Korea

[73] Assignee: Samsung Electronics Co., Ltd., Suwon, Rep. of Korea

[21] Appl. No.: 781,374

[22] Filed: Jan. 21, 1997

[30] Foreign Application Priority Data

Jun. 25, 1996 [KR] Rep. of Korea ................... 1996-23696

[51] Int. Cl.[6] ................................................ H01L 21/8242
[52] U.S. Cl. ........................... 438/253; 438/244; 438/633
[58] Field of Search .................................... 438/243, 244, 438/253, 633, 636, 637

[56] References Cited

U.S. PATENT DOCUMENTS 5,665,624  9/1997  Hong ........................................ 438/244
5,688,720 11/1997  Hayashi .................................. 438/633
5,723,381  3/1998  Grewal et al. .......................... 438/633

*Primary Examiner*—Chandra Chaudhari
*Attorney, Agent, or Firm*—Myers Bigel Sibley & Sajovec

[57] ABSTRACT

Integrated circuit memory devices are manufactured by forming spaced apart source and drain regions in an integrated circuit substrate, and an insulated gate on the integrated circuit substrate therebetween. An interlayer insulating layer is formed on the integrated circuit substrate, including first and second conductive pad contacts which extend therethrough and which electrically contact the source and the drain region, respectively. A trench is formed in the interlayer insulating layer, including in the second conductive pad contact. A first insulating layer is formed to line the trench, except for adjacent the second conductive pad contact. A buried bit line is formed in the trench, electrically contacting the second conductive pad contact through the first insulating layer. A second insulating layer is formed on the first insulating layer and on the buried bit line, except for adjacent the first conductive pad contact. A patterned storage electrode is formed on the second insulating layer, which electrically contacts the first conductive contact pad.

19 Claims, 8 Drawing Sheets

METHODS FOR MANUFACTURING INTEGRATED CIRCUIT MEMORY DEVICES INCLUDING TRENCH BURIED BIT LINES

FIELD OF THE INVENTION

This invention relates to integrated circuit manufacturing methods, and more particularly to manufacturing methods for integrated circuit memory devices.

BACKGROUND OF THE INVENTION

As is well known to those having skill in the art, integrated circuit dynamic random access memories (DRAM) comprise an array of memory cells, each of which includes a transistor and a capacitor. In order to increase the cell capacitance, it is known to increase the surface area of the capacitor plates, reduce the thickness of the dielectric material, and/or use a dielectric material having a high dielectric constant, such as tantalum dioxide.

One technique for increasing the surface area of the capacitor plates, uses a "stacked cell" process rather than a planar process. Unfortunately, as the integration density of DRAMs continues to increase, the use of stacked cells may reduce the process margin during manufacture of the DRAM. These reduced process margins may make it difficult to increase the integration density of the DRAM.

As the integration density of DRAMs continues to increase, the cell capacitance generally tends to decrease as the memory cell area is reduced. Reduced capacitance may reduce the ability to accurately read data from the memory cell, and may increase the soft error rate. DRAM operation may become difficult at low voltage without excessive power consumption.

For example, if a 64 megabit DRAM includes a memory cell area of about 1.5 $\mu m^2$ using a two dimensional stacked memory cell, it may be difficult to obtain sufficient capacitance even when using a material having a high dielectric constant. Thus, a three dimensional stacked capacitor has been proposed to increase the capacitance. A conventional method for manufacturing an integrated circuit memory device will now be described with reference to FIGS. 1 through 3.

Referring to FIG. 1, a transistor having a drain region 5, a source region 7 and a gate electrode 9 is formed on an active area defined by a field oxide film 3 which acts as an inactive area of a semiconductor substrate 1. Also, an insulating film 11 for insulating the gate electrode 9 is formed in a predetermined shape. Next, a first interlayer insulating film 15 is formed on the entire surface of the resultant structure, and partially etched to form a bit line contact hole. Then, a conductive material is deposited to fill the bit line contact hole, and is patterned to form a buried bit line 13 connected to the drain region 5.

Subsequently, a second interlayer insulating film 15' is formed on the structure on which the bit line 13 and the transistor are formed. Thereafter, the first and second interlayer insulating films 15 and 15' which are stacked on the upper part of the source region 7, are partially etched to form a storage node contact hole 17.

Referring to FIG. 2, a polysilicon film 19 is formed so as to bury the storage node contact hole 17 and have a predetermined thickness on the second interlayer insulating film 15'. A photoresist pattern 21 for forming a storage electrode is formed on the polysilicon film 19.

Referring to FIG. 3, a storage electrode 19a is formed by partially etching the polysilicon film 19 using the photoresist pattern 21 as an etch mask. Also, a dielectric film 23 and a conductive plate electrode 25 are formed on the entire surface of the silicon substrate 1 on which a storage electrode 19a is formed. Thus, a memory device having a capacitor is manufactured.

However, according to the above-described conventional method for manufacturing a capacitor of a memory device, the first and second interlayer insulating films 15 and 15', which insulate the bit line 13 electrically connected to the drain region 5 of the transistor, may increase the step difference between the storage node 19a and source region 7. Therefore, in forming a contact hole for electrically connecting the storage node 19a to the source region 7, an overlay margin or focus depth may be reduced. Accordingly, the probability of generating a misalignment of the storage node and the source region may increase, or the source region may not be fully opened, thereby reducing the performance of the device.

SUMMARY OF THE INVENTION

It is therefore an object of the present invention to provide improved methods of manufacturing integrated circuit memory devices.

It is another object of the invention to provide improved methods of fabricating integrated circuit DRAM memory devices.

It is yet another object of the present invention to provide methods of manufacturing integrated circuit memory devices which can reduce the step difference between the storage node and the source region thereof.

These and other objects are provided, according to the present invention, by forming conductive pad contacts which extend through an interlayer insulating layer to contact the source and drain regions, and forming a buried bit line in a trench which electrically contacts one the conductive pads. Accordingly, the step difference between the storage node and the source region can be reduced.

In particular, according to the present invention, integrated circuit memory devices are manufactured by forming spaced apart source and drain regions in an integrated circuit substrate, and an insulated gate on the integrated circuit substrate therebetween. An interlayer insulating layer is formed on the integrated circuit substrate, including first and second conductive pad contacts which extend therethrough and which electrically contact the source and the drain region, respectively. A trench is formed in the interlayer insulating layer, including in the second conductive pad contact. A first insulating layer is formed to line the trench, except for adjacent the second conductive pad contact. A buried bit line is formed in the trench, electrically contacting the second conductive pad contact through the first insulating layer. A second insulating layer is formed on the first insulating layer and on the buried bit line, except for adjacent the first conductive pad contact. A patterned storage electrode is formed on the second insulating layer, which electrically contacts the first conductive contact pad.

Preferably, the interlayer insulating layer is formed by forming a flowable insulating material on the integrated circuit substrate and flowing the flowable insulating material. A second insulating material is then formed on the flowed insulating material. The flowed insulating material and the second insulating material are then etched to form first and second contact holes which expose the source and drain regions respectively. Then, a conductive contact layer is blanket formed on the second insulating material and in the first and second contact holes. The conductive contact layer is removed from the second insulating material. The conductive contact layer is preferably phosphorus-doped polysilicon.

The buried bit line may be formed by blanket forming a doped polysilicon layer on the first insulating layer and in the trench, and removing the doped polysilicon layer from outside the trench. Alternatively, the buried bit line may be formed by forming a titanium layer in the trench and reacting the titanium with silicon from the second conductive contact pad, to form titanium silicide. A layer of TiN/W is formed on the first insulating layer and on the titanium silicide. The layer is then planarized until the first conductive contact pad is exposed.

In a specific embodiment of the present invention, a memory device is formed by forming a device isolation film which defines an active region and a device isolation region in an integrated circuit substrate. A transistor, having spaced apart drain and source regions and a gate electrode therebetween, is formed within the active region. An interlayer insulating film is formed on the transistor. A plurality of first contact holes, which expose the source and drain regions of the transistor, are then formed by patterning the interlayer insulating film. A pad conductive layer is then formed to fill the first contact holes. A plurality of trenches are formed by partially etching the pad conductive layer and the interlayer insulating film. A first insulating layer is formed on the pad conductive layer and on the interlayer insulating film, and lining the trenches. A second contact hole, which partially exposes the surface of the trenches on the drain region of the transistor is formed, by partially etching and removing the first insulating layer.

A bit line which is electrically connected to the pad conductive layer and the drain region of the transistor through the second contact hole is then formed, by forming a first conductive layer which fills the second contact hole. A second insulating layer is formed on the bit line, on the pad conductive layer and on the interlayer insulating film. A third contact hole, which partially exposes the pad conductive layer on the source region of the transistor, is then formed by patterning the second insulating layer. A storage electrode, which is electrically connected to the pad conductive layer and to the source region of the transistor through the contact hole, is then formed by blanket forming a second conductive layer on the second insulating layer and patterning the second conductive layer.

Preferably, the gate electrode of the transistor is insulated by a gate insulating layer which includes a silicon nitride spacer. An antireflective coating may be formed after the interlayer insulating film is formed. The second and third contact holes may be formed using an anisotropic dry etching process. The width of the bit line is also preferably adjusted to be as thick as the first insulating layer.

Accordingly, step differences between the storage node and source region may be reduced by filling the bit line in a pad conductive layer. Therefore, the probability of misalignment between the storage node and source region may be reduced, and it may be easier to completely open the source region. Performance of the memory devices may thereby be increased.

DETAILED DESCRIPTION OF PREFERRED EMBODIMENTS

Figure 1:
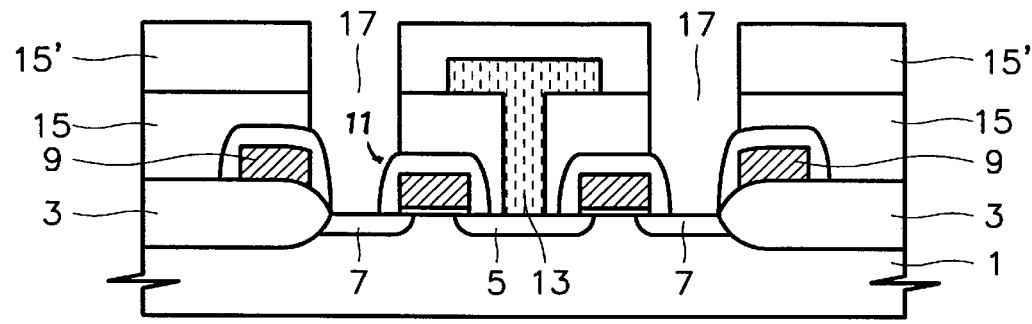
FIGS. 1 to 3 are cross-sectional views showing a conventional method for manufacturing a memory device.
Figure 2:
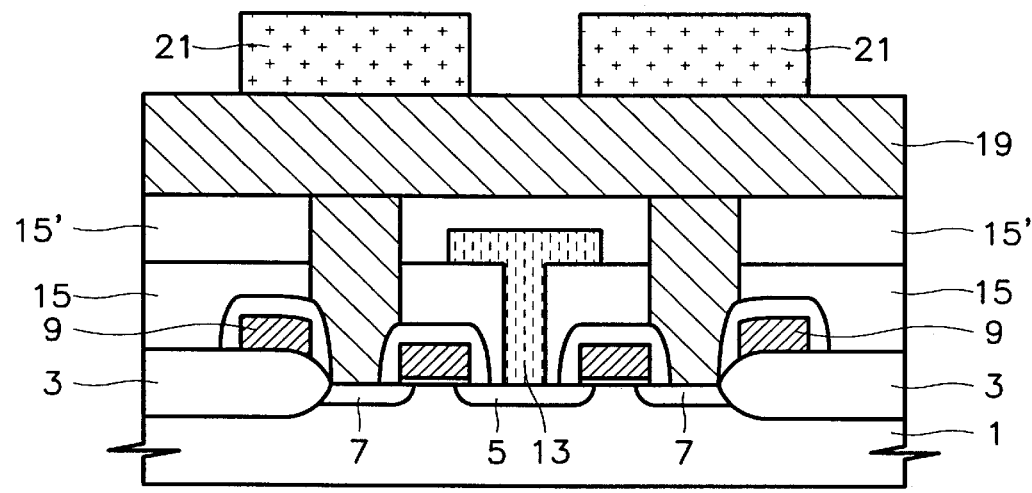
Figure 3:
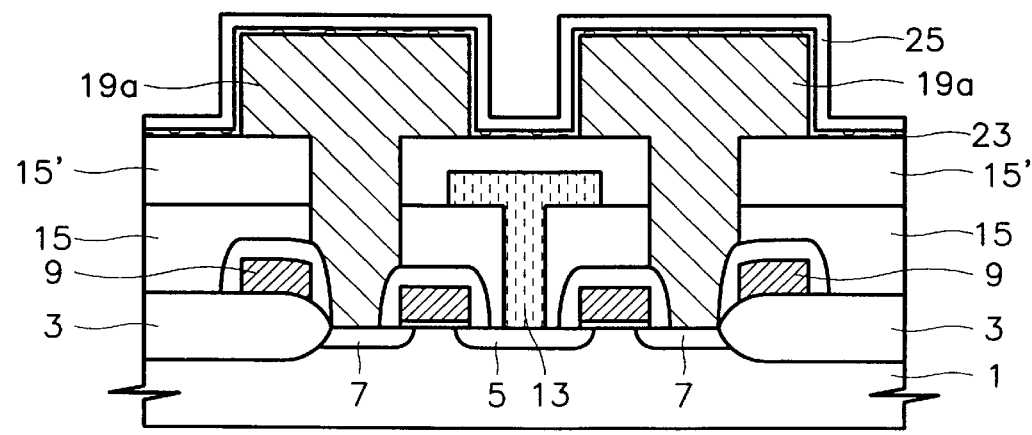

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout. Moreover, each embodiment described and illustrated herein includes its complementary conductivity embodiment as well. It will also be understood that when a layer is referred to as being "on" another layer or substrate, it can be directly on the other layer or substrate, or intervening layers may also be present.

Figure 4:
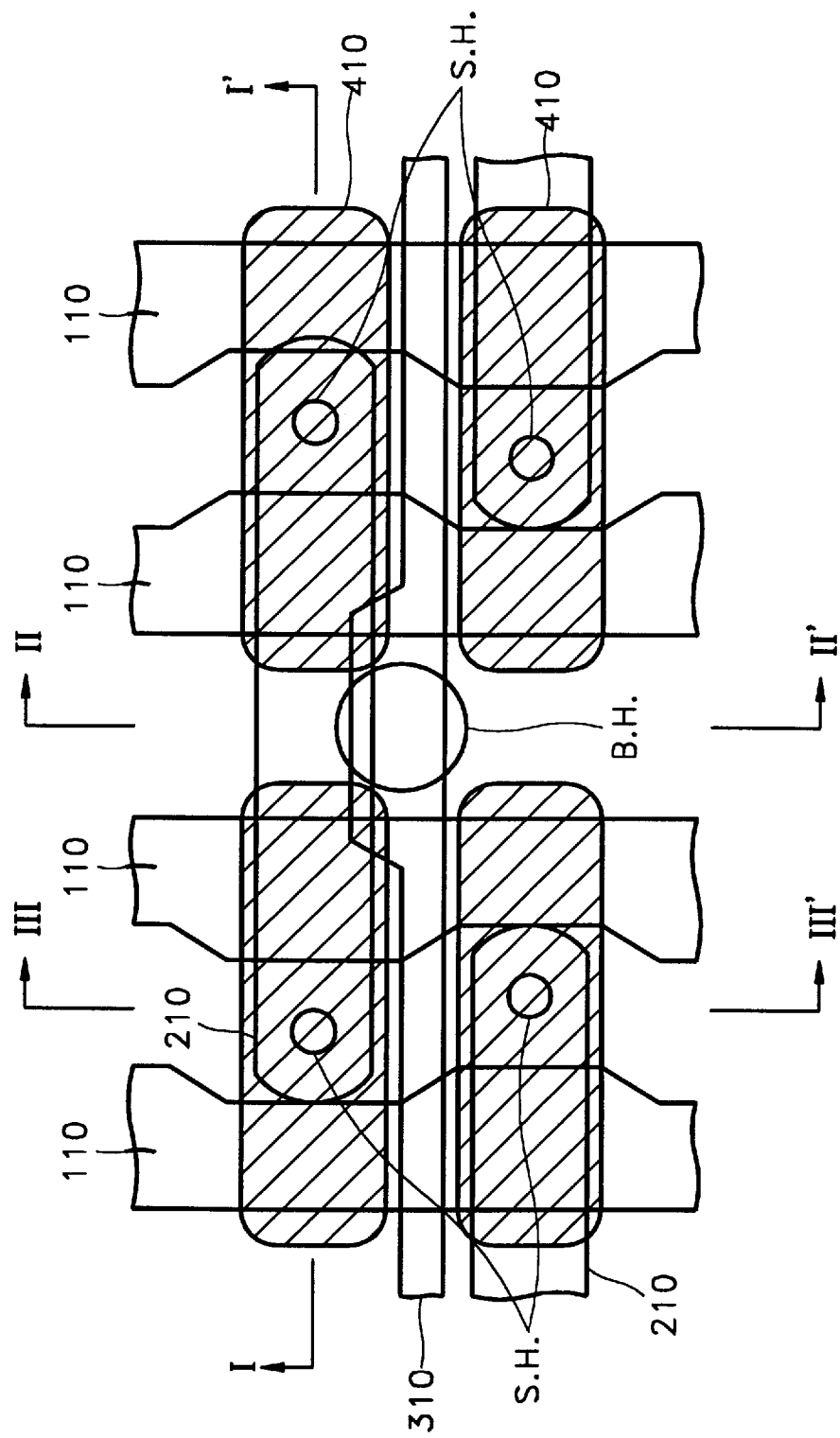
FIG. 4 is a plan view showing a schematic memory device manufactured according to an embodiment of the present invention.

FIG. 4 is a plan view of a DRAM cell manufactured according to an embodiment of the present invention. Reference numeral 110 denotes a gate electrode, reference numeral 210 denotes an active region, reference numeral 310 denotes a bit line, reference numeral 410 denotes a storage electrode, reference character B.H. denotes a bit line contact hole and reference character S.H. denotes a storage node contact hole.

FIGS. 5 to 8 are cross-sectional views, taken along line I—I' of FIG. 4, illustrating a memory device manufacturing method according to an embodiment of the present invention, up to a step of forming a pad conductive layer.

Figure 5:
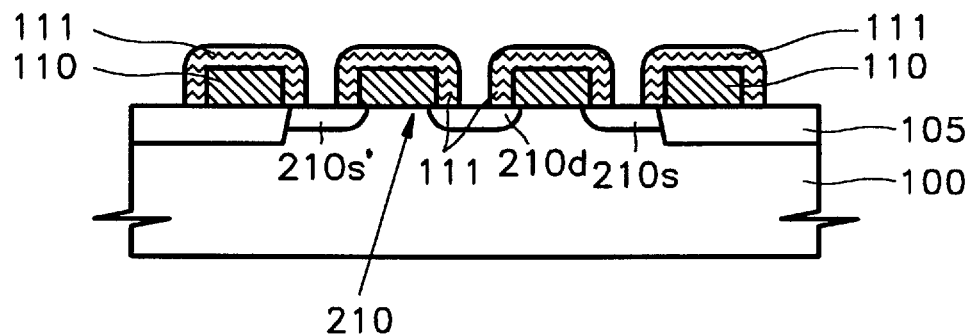
FIGS. 5, 6A and 7–8 are cross-sectional views, taken along line I—I'of FIG. 4, illustrating a memory device manufacturing method according to an embodiment of the present invention.

Referring to FIG. 5, a field oxide film 105 is formed on the surface of a silicon substrate 100 using a conventional local oxidation of silicon (LOCOS) process or a device isolation method using a trench, to thus define an active area 210. Next, a gate oxide film (not shown) is formed on the active area 210 using a thermal oxidation process. Then, a conductive layer for a gate electrode is formed by depositing polysilicon. A nitride layer is formed by depositing silicon nitride on the conductive layer to a thickness of about 500 Å to 3000 Å through a chemical vapor deposition (CVD) process. Then, a gate electrode 110 and an insulating layer for covering an upper surface of the gate electrode 110 are formed by partially removing the nitride layer and the conductive layer. Thereafter, an oxide film (not shown) having a thickness of about 30 Å to 100 Å at a temperature of about 600° C. to 950° C. can be formed to recover the gate electrode damaged while patterning the same.

Next, silicon nitride is deposited on the entire resultant surface to a thickness of about 200 Å to 2000 Å. Then, a gate insulating layer 111 surrounding the upper and lateral surfaces of the gate electrode is formed by forming a spacer-type insulating layer on the sidewall of the gate electrode 110 using a dry etching process and an etch-back process.

Thereafter, a transistor having source region 210s and drain region 210d is formed by implanting impurities to the silicon substrate 100 exposed through the gate insulating layer 111.

Figure 6A:
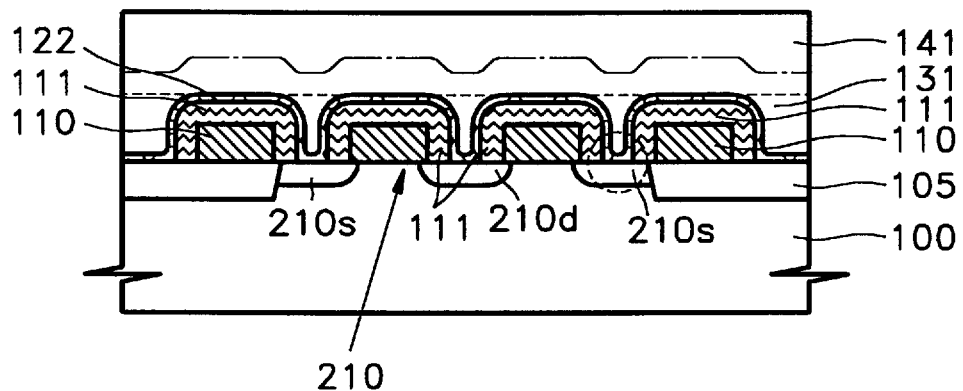
Figure 6B:
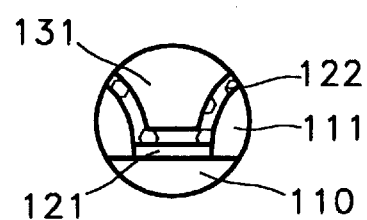
FIG. 6B is an enlarged view of the circled portion of FIG. 6A.

Referring to FIGS. 6A and 6B, a thermal oxide film 121 having a thickness of about 10 Å to 100 Å at a temperature of about 600° C. to 950° C. is formed on the source region 210s and drain region 210d exposed through the gate insulating layer 111. Then, a first nitride layer 122 having a thickness of about 50 Å to 500 Å is formed by depositing silicon nitride on the entire resultant surface through the CVD method.

An insulating material which is fluid at a high temperature, such as borophosposilicate glass (BPSG), phosposilicate glass (PSG), or $O_3$-tetraethyl orthosilicate ($O_3$-TEOS), is deposited via the CVD process to a predetermined thickness which is greater than the sum of thicknesses of the gate electrode 110, gate insulating layer 111 and first nitride layer 122, on the entire resultant surface on which the first nitride layer 122 is formed. The flowable insulating material is then flowed at a high temperature, thereby forming a first interlayer insulating film 131 (semi-hashed line). For example, when using the BPSG to form the first interlayer insulating film 131, the BPSG is deposited on the first nitride layer 122 to a thickness of about 6000 Å and is flowed under a vapor atmosphere of a high temperature of about 800° C. or under a nitrogen atmosphere of a high temperature of about 830° C.

Next, the first interlayer insulating film 131 is polished using a CMP process until the first nitride layer 122 is exposed, to leave the same to a predetermined thickness (hashed line). Also, an oxide such as a high temperature oxide (HTO), a plasma TEOS, or a plasma silane is deposited to a thickness of about 500 Å to 5000 Å on the entire surface of the resultant structure through the CVD process, thereby forming a second interlayer insulating film 141 having a flat surface.

Figure 7:
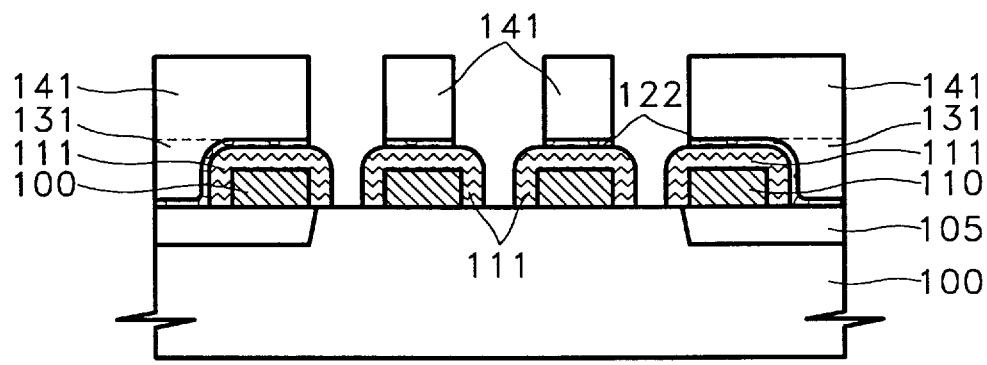

Referring to FIG. 7, a mask (not shown) having a predetermined pattern is formed on the second interlayer insulating film 141 by photolithography. The first and second interlayer insulating films 131 and 141 exposed through the patterned mask are partially removed by an etching process to thus open the source region 210s and drain region 210d of the transistor, thereby forming a storage node contact hole and a bit line contact hole. As shown, the etching process is performed by a self-aligned contact etching wherein the first and second interlayer insulating films 131 and 141 are selectively removed with respect to the first nitride layer 122.

Here, according to another embodiment of the present invention, when the photolithography is performed by a deep ultraviolet (DUV) etching process such as KrF, polysilicon is deposited to about 500 Å thickness on the second interlayer insulating film 141 by a CVD process to obtain an anti-reflective coating. Then, the storage node contact hole and the bit line contact hole are formed by the photolithography and the self-aligned contact etching process, as described above.

The mask remaining on the second interlayer insulating film 141 is removed. The thermal oxide film 121 and a portion of the first nitride layer 122 exposed through the storage node contact hole and the bit line contact hole are removed with respect to the gate insulating film 111 using a residual treatment process having little etch selection ratio.

Figure 8:
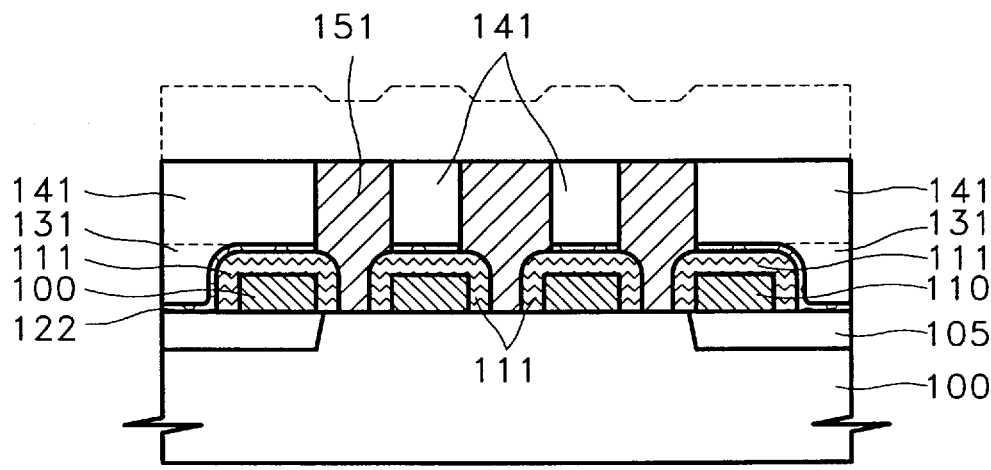

Referring to FIG. 8, polysilicon doped with phosphorus is deposited by the CVD process to preferably completely fill up the storage node contact hole and the bit line contact hole and form a predetermined thickness on the second interlayer insulating film 14 as shown in a hashed line on the drawing. Then, the polysilicon doped with phosphorus is polished through a flattening process such as the CMP process or an ion milling process until the second interlayer insulating film 141 is exposed, to form a pad conductive layer 151 which fills the storage node contact hole and the bit line contact hole.

FIGS. 9A to 13B are cross-sectional views, taken along lines II—II' and III—III' of FIG. 4, for illustrating a method for forming a buried bit line and a storage electrode according to an embodiment of the present invention, which show subsequent steps of a pad conductive layer forming step. The "A" drawings are taken along the II—II' line and the "B" drawings are taken along the line III—III'.

Figure 9A:
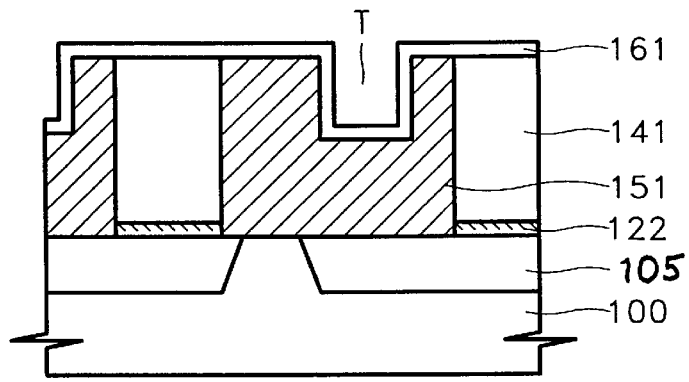
FIGS. 9A to 13B are cross-sectional views, taken along lines II—II' and III—III' of FIG. 4, illustrating a method for forming a buried bit line and a storage electrode according to an embodiment of the present invention.
Figure 9B:
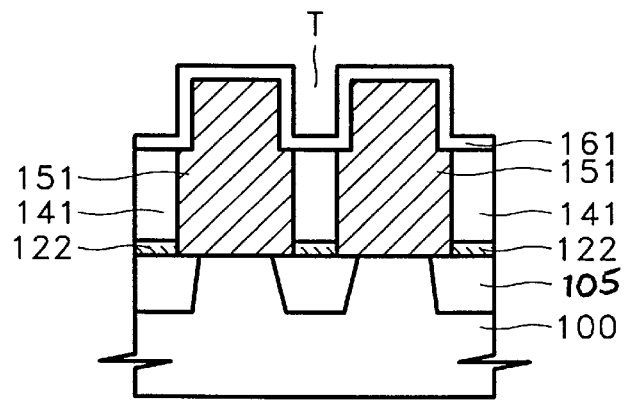

Referring to FIGS. 9A and 9B, a photoresist pattern (not shown) is formed on the pad conductive layer 151 and the second interlayer insulating film 141 using photolithography. The pad conductive layer 151 and the second interlayer insulating film 141 are partially removed to a predetermined depth using the photoresist pattern as a mask by a dry etching process such as a reactive ion etching process, thereby forming a trench T. Next, the photoresist pattern is removed, and an insulating material such as silicon oxide ($SiO_2$), silicon nitride (SiN), or SiON is deposited by the CVD process to a predetermined thickness on the entire surface of the resultant structure on which the trench is formed, to thus form a bit line insulating film 161.

Here, the trench (T) is formed in the same pattern as that of a bit line to be formed in a subsequent process. The depth of the trench (T) is adjusted such that the bit line to be formed by the subsequent process is completely or partially buried in the second interlayer insulating film 141.

According to another embodiment of the present invention, before a step of coating a photoresist for forming the trench, there is further included a step for forming an oxide film (not shown) by depositing an oxide material such as TEOS, HTO, or P-Silane by the CVD process to a predetermined thickness on the surfaces of the pad conductive layer 151 and second interlayer insulating film 141. Here, the oxide film is also removed when removing the photoresist pattern.

Meanwhile, the bit line insulating film 161 is formed in the same topology as that of the resultant structure on which the trench (T) is formed, and the line width of the bit lines limited by the trench (T) can be reduced. Also, the bit line insulating film 161 prevents the bit line which is electrically connected to the drain region of the transistor through the pad conductive layer 151, from being electrically shorted with the adjacent bit line by the subsequent deposition process. The bit line insulating film 161 also prevents the bit line from being electrically shorted with the pad conductive layer 151 connected to the source region 210s of the transistor.

Figure 10A:
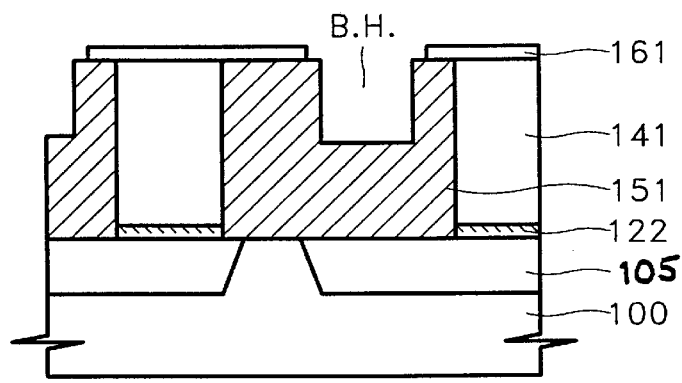
Figure 10B:
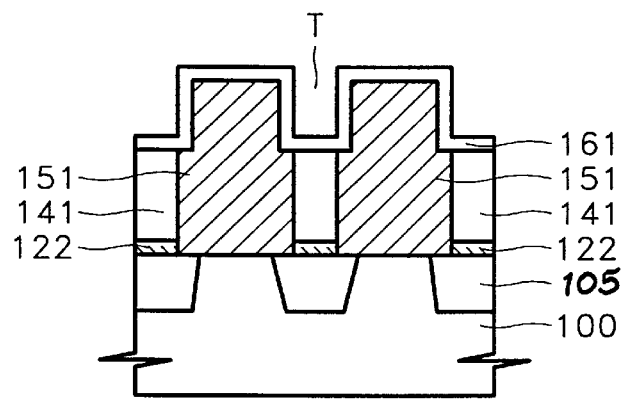

Referring to FIGS. 10A and 10B, a photoresist is coated to a predetermined thickness on the bit line insulating film 161 and a photoresist pattern (not shown) of a predetermined shape is then formed by photolithography. The bit line insulating film 161 formed on the surface of the trench (T) formed on the pad conductive layer 151 electrically connected to the drain region 210d of the transistor is removed using the photoresist pattern as a mask.

At this time, it is preferable that the bit line insulating film 161 is partially removed by a dry etching process such as a reactive ion etching process having good anisotropic etching. Therefore, a bit line contact hole (B.H.), which partially exposes a portion of the pad conductive layer 151 electrically connected to the drain region of the transistor, is formed.

Figure 11A:
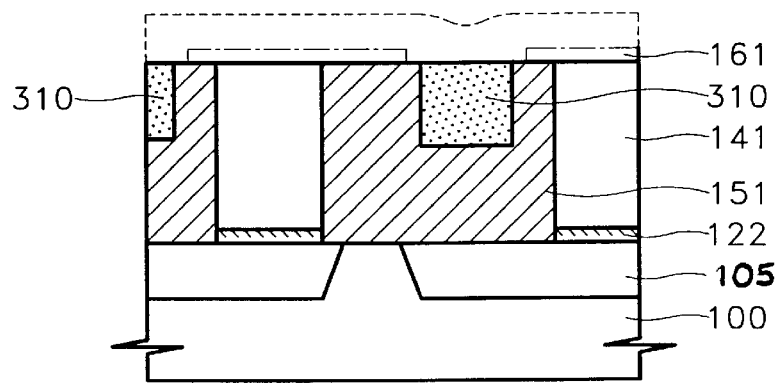
Figure 11B:
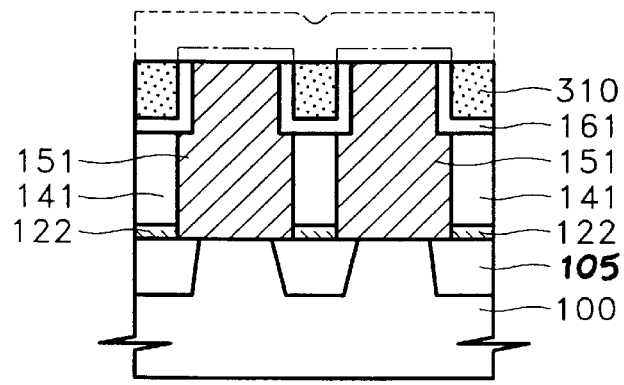

Referring to FIGS. 11A and 11B, a conductive material is deposited on the entire surface of the resultant structure, on which the bit line contact hole (B.H.) is formed, using a CVD or PVD (physical vapor deposition) process, thereby filling the bit line contact hole (B.H.) and depositing the same to a predetermined thickness on the resultant structure.

Thereafter, the conductive material layer and the bit line insulating film 161 are partially removed by performing a chemical-mechanical polishing (CMP) process until the second interlayer insulating film 141 and the pad conductive layer 151 are exposed, thereby forming a bit line 310 having a predetermined line width. The bit line 310 is electrically connected to the drain region 210d of the transistor through the pad conductive layer, and is electrically insulated from the adjacent drain region of the transistor through the second interlayer insulating film 141. Also, the bit line 310 is electrically insulated from the source region 210s of the transistor and the pad conductive layer electrically shorted therewith by the bit line insulating film 161. Thus, the bit line 310 is electrically shorted with the drain region of the transistor as shown in FIG. 4, but is electrically insulated from the source region of the transistor.

Here, the bit line 310 is formed by a damascene process wherein polycrystalline silicon doped with impurities is deposited using the CVD process and is then planarized using the CMP process. Otherwise, the bit line 310 may be formed by the modification of the damascene process wherein titanium is deposited and reacted through a rapid thermal annealing (RTA) process, the remaining titanium is removed and TiN/W to be formed later by the deposition process is planarized by the CMP process.

At this time, the CMP process may be performed until the bit line insulating film 161 is exposed or until the bit line 310 filling the bit line contact hole (B.H.) is etched to a predetermined thickness.

Figure 12A:
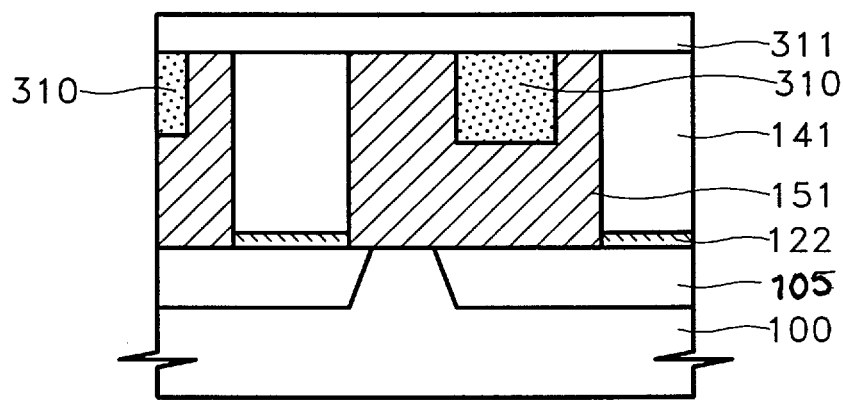
Figure 12B:
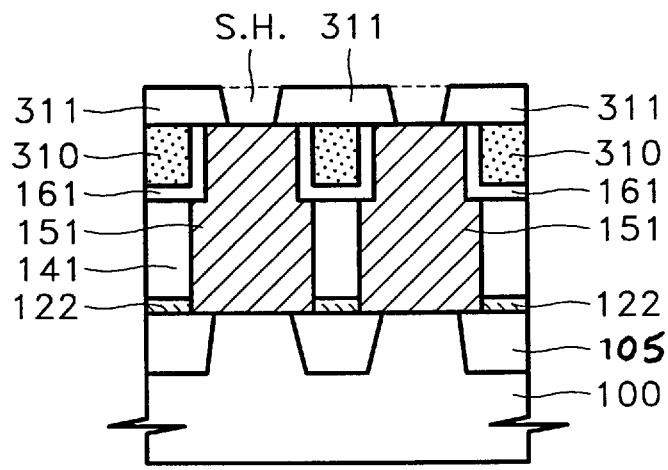

Referring to FIGS. 12A and 12B, a node insulating film 311 is formed by depositing an oxide or a nitride to a predetermined thickness using the CVD or PVD process on the resultant structure on which the bit line 310 is formed. Then, a photoresist (not shown) of a predetermined pattern is formed by spin-coating the photoresist to a predetermined thickness on the node insulating film 311 and patterning the coated photoresist.

Subsequently, a portion of the node insulating film 311 exposed through the photoresist pattern is removed using a dry etching process such as a reactive ion etching (RIE) process having anisotropic etching, thereby forming a storage node contact hole (S.H.). At this time, the pad conductive layer 151 electrically connected to the source region 210s of the transistor is partially exposed through the storage node contact hole (S.H.). Since the bit line 310 is buried in the second interlayer insulating film 141 and pad conductive layer 151, the node insulating film 311 need not be thick. Thus, the storage node contact hole (S.H.) can be formed without great difficulty.

Figure 13A:
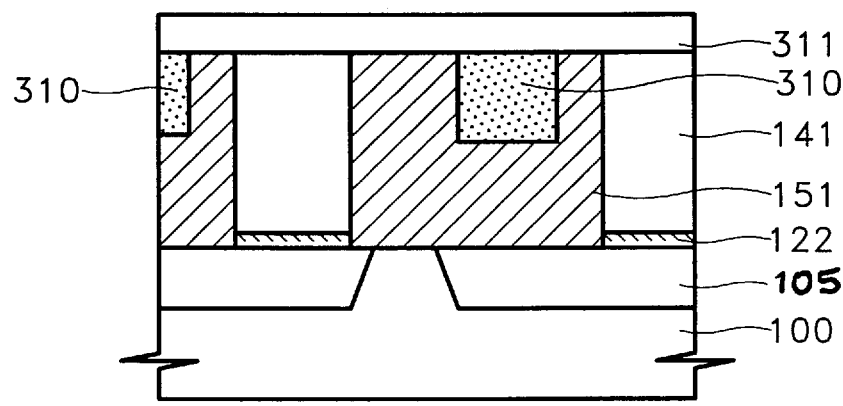
Figure 13B:
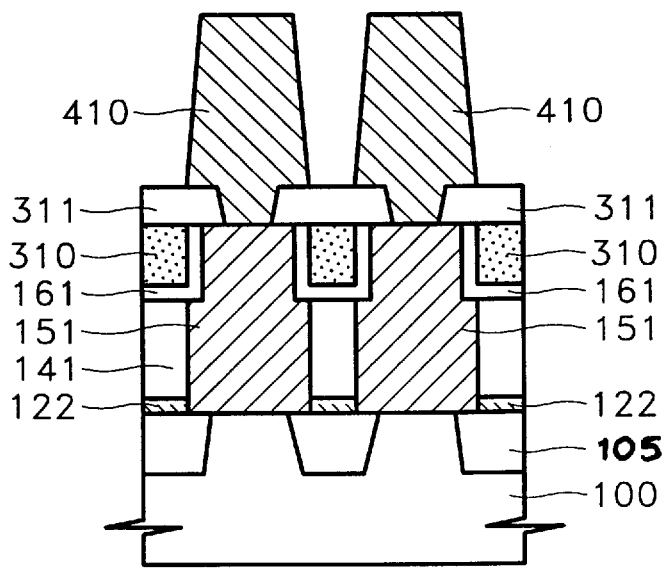

Referring to FIGS. 13A and 13B, a conductive layer electrically connected to the source region 210s of the transistor through the storage node contact hole (S.H.) is formed by depositing a conductive material to a predetermined thickness using the CVD or PVD process on the resultant structure on which the storage node contact hole (S.H.) is formed. Then, a plurality of storage electrodes 410 are formed by patterning the conductive layer to a predetermined shape using a mask pattern formed on the conductive layer by the photolithography.

Thereafter, although not shown, a dielectric layer and a plate electrode are formed by sequentially depositing a dielectric material and a conductive material on the storage electrode 410.

As described above, according to the present invention, since the bit line is buried in a pad conductive layer and a second interlayer insulating film, the step difference between a source region of a transistor and a storage node of a DRAM capacitor formed in a capacitor over-bit line structure can be reduced. Thus, the probability of generating a misalignment of the storage node and the source region may be reduced, and the source region may be completely opened, which can improve the performance of the semiconductor device.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed:

1. A memory device manufacturing method comprising the steps of:

forming a device isolation film which defines an active region and a device isolation region in an integrated circuit substrate;

forming a transistor having spaced apart drain and source regions and a gate electrode therebetween, within said active region;

forming an interlayer insulating film on said transistor;

forming a plurality of first contact holes which expose said source and drain regions of said transistor, by patterning said interlayer insulating film;

forming a pad conductive layer in said first contact holes;

forming a plurality of trenches by partially etching said pad conductive layer and interlayer insulating film;

forming a first insulating layer on the pad conductive layer and on the interlayer insulating film, and lining the trenches;

forming a second contact hole which partially exposes the surface of said trenches formed on said drain region of said transistor, by partially etching said first insulating layer;

forming a bit line which is electrically connected to said pad conductive layer and said drain region of said transistor through said second contact hole, by forming a first conductive layer in said second contact hole;

forming a second insulating layer on the bit line, on the pad conductive layer and on the interlayer insulating film;

forming a third contact hole which partially exposes said pad conductive layer on said source region of said transistor, by patterning said second insulating layer; and forming a storage electrode which is electrically connected to said pad conductive layer and to said source region of said transistor through said third contact hole by blanket forming a second conductive layer on the second insulating layer, and patterning said second conductive layer.

2. A memory device manufacturing method according to claim 1, wherein said gate electrode of said transistor is insulated by a gate insulating layer including a spacer of silicon nitride.

3. A memory device manufacturing method according to claim 2, wherein said interlayer insulating film is formed by stacking a first interlayer insulating film of a flowable oxide and a second interlayer insulating film of an oxide.

4. A memory device manufacturing method according to claim 3, wherein said first interlayer insulating film is planarized using a chemical-mechanical polishing process.

5. A memory device manufacturing method according to claim 1, further comprising the step of forming an anti-reflective coating layer after said interlayer insulating film forming step.

6. A memory device manufacturing method according to claim 1, wherein said pad conductive layer comprises phosphorus-doped polysilicon.

7. A memory device manufacturing method according to claim 1, wherein said second and third contact holes are formed using an anisotropic dry etching process.

8. A memory device manufacturing method according to claim 1, wherein a line width of said bit line is adjusted to be as thick as said first insulating layer.

9. A memory device manufacturing method according to claim 1, wherein said bit line forming step-comprises the steps of forming a doped polysilicon layer and planarizing said doped polysilicon layer using a chemical-mechanical polishing (CMP) process.

10. A memory device manufacturing method according to claim 9, wherein said CMP process is performed until said pad conductive layer is exposed.

11. A memory device manufacturing method according to claim 9, wherein said CMP process is performed until said first insulating layer is exposed.

12. A memory device manufacturing method according to claim 9, wherein said CMP process is performed until said second conductive layer in said second contact hole is etched to a predetermined thickness.

13. A memory device manufacturing method according to claim 1, wherein said bit line forming step comprises the steps of depositing titanium; reacting the titanium with silicon; removing any remaining titanium; depositing TiN/W to form a TiN/W layer; and planarizing said TiN/W layer until said pad conductive layer is exposed, using a CMP process.

14. A method of manufacturing an integrated circuit memory device, comprising the steps of:

forming spaced apart source and drain regions in an integrated circuit substrate, and an insulated gate on the integrated circuit substrate therebetween;

forming an interlayer insulating layer on the integrated circuit substrate, including first and second conductive pad contacts which extend therethrough and which electrically contact the source region and the drain region, respectively;

forming a trench in the interlayer insulating layer, including in the second conductive pad contact;

forming a first insulating layer which lines the trench, except for adjacent the second conductive pad contact;

forming a buried bit line in the trench, electrically contacting the second conductive pad contact through the first insulating layer;

forming a second insulating layer on the first insulating layer and on the buried bit line, except for adjacent the first conductive pad contact; and forming a patterned storage electrode on the second insulating layer, which electrically contacts the first conductive pad contact.

15. A method according to claim 14 wherein the step of forming an interlayer insulating layer comprises the steps of:

forming a flowable insulating material on the integrated circuit substrate;

flowing the flowable insulating material;

forming a second insulating material on the flowed insulating material; and etching the flowed insulating material and the second insulating material to form first and second contact holes which expose the source and drain regions, respectively.

16. A method according to claim 15 wherein the etching step is followed by the steps of:

blanket forming a conductive contact layer on the second insulating material and in the first and second contact holes; and removing the conductive contact layer from the second insulating material.

17. A method according to claim 16 wherein the blanket forming step comprises the step of:

blanket forming a phosphorous doped polysilicon layer on the second insulating material and in the first and second contact holes.

18. A method according to claim 14 wherein the buried bit line forming step comprises the steps of:

blanket forming a doped polysilicon layer on the first insulating layer and in the trench; and removing the doped polysilicon layer from outside the trench.

19. A method according to claim 14 wherein the buried bit line forming step comprises the steps of:

forming a titanium layer in the trench;

reacting the titanium with silicon from the second conductive pad contact to form titanium silicide;

forming a layer of TiN/W on the first insulating layer and on the titanium silicide; and planarizing until the first conductive contact pad is exposed.

* * * * *